United States Patent [19]

Omet et al.

[11] Patent Number: 4,695,796

[45] Date of Patent: Sep. 22, 1987

[54] MAGNETO-OPTIC MEASURING DEVICE

[75] Inventors: Reinhard Omet, Babenhausen; Hans Kindsvater, Bad Homburg; Hans J. Wall, Darmstadt, all of Fed. Rep. of Germany

[73] Assignee: Phönix Armaturen-Werke Bregel GmbH, Frankfurt, Fed. Rep. of Germany

[21] Appl. No.: 670,142

[22] Filed: Nov. 9, 1984

[30] Foreign Application Priority Data

Nov. 15, 1983 [DE] Fed. Rep. of Germany ....... 3341265

[51] Int. Cl.⁴ .................... G01B 21/00; G01N 27/72; G01R 33/00
[52] U.S. Cl. ................... 324/226; 73/314; 250/577; 324/207; 324/260; 324/262; 324/244; 350/377
[58] Field of Search ................ 324/96, 244, 117, 249, 324/207, 208, 246, 260–262, 226; 350/377, 375, 376; 250/225, 577; 73/308, 313, 314, DIG. 4, DIG. 5; 340/706, 795

[56] References Cited

U.S. PATENT DOCUMENTS

| | | | |
|---|---|---|---|
| 1,502,125 | 7/1924 | Scott | 73/314 |
| 2,685,797 | 8/1954 | Morschel | 73/DIG. 5 X |
| 2,720,785 | 10/1955 | Sedgwick | 73/314 |
| 3,122,734 | 2/1964 | Rice | 340/795 X |
| 3,130,348 | 4/1964 | Lieb | 390/795 X |
| 3,350,978 | 11/1967 | Alers | 324/244 X |
| 3,353,097 | 11/1967 | Johnson | 324/244 X |
| 3,413,055 | 11/1968 | Sorbo | 324/244 X |
| 3,621,390 | 11/1971 | Von Willisen | 324/244 X |
| 4,123,783 | 10/1978 | Pearson et al. | 340/706 X |
| 4,194,397 | 3/1980 | Yasuda | 73/314 |
| 4,243,936 | 1/1981 | Papp et al. | 324/244 X |
| 4,259,975 | 4/1981 | Kinsey, Jr. et al. | 73/313 X |
| 4,449,096 | 5/1984 | Doriath et al. | 324/244 |
| 4,471,351 | 9/1984 | Anderson | 340/795 X |
| 4,516,073 | 5/1985 | Doriath et al. | 324/244 |
| 4,531,092 | 7/1985 | Shibano | 324/244 |
| 4,539,521 | 9/1985 | Matsumoto | 324/244 |
| 4,581,579 | 4/1986 | Nagatsuma et al. | 350/370 X |
| 4,604,577 | 8/1986 | Matsumura et al. | 324/244 |

FOREIGN PATENT DOCUMENTS 0020063 2/1977 Japan ..................... 324/207

*Primary Examiner*—Reinhard J. Eisenzopf
*Assistant Examiner*—Warren S. Edmonds
*Attorney, Agent, or Firm*—Michael J. Striker

[57] ABSTRACT

A measuring device includes means for converting a physical quantity to be measured into a corresponding magnetic field. A magnetooptic element is aligned with a polarizer which passes incident light in one plane only. The part of the magnetooptic element which intercepts the transmitted magnetic field rotates the throughgoing light and the position of rotation is indicated on an optical indicator.

17 Claims, 9 Drawing Figures

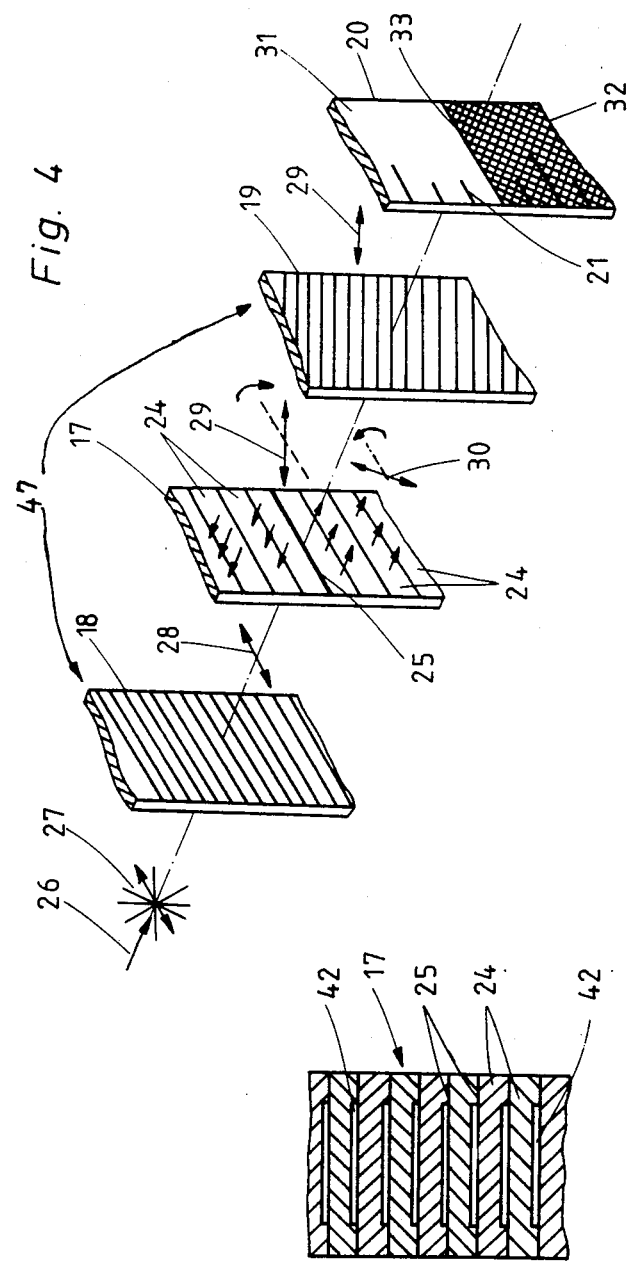

MAGNETO-OPTIC MEASURING DEVICE

BACKGROUND OF THE INVENTION

The present invention relates in general to a measuring device and in particular to a device for measuring physical quantities such as length, angles, positions, temperature, electrical current and the like by means of a pick-up unit of measured data and an indicating unit controlled by the pick-up unit.

In conventional measuring devices of this kind the physical quantity to be measured is always converted by the pick-up unit in an electrical signal which is applied to an indicator which makes the measured value visible. Technical expenditures of such prior art measuring devices are not negligible.

In other kinds of measuring devices, there is a direct coupling of mechanical indicating elements to a measuring value pick-up unit. For example, in a liquid level gauge of a storing tank a float including permanent magnets is aligned in the direction of magnetic field with magnetic indicating elements. Also these mechanical solutions necessitate an expensive manufacture, are sensitive to rough operational conditions and exhibit only limited resolution.

SUMMARY OF THE INVENTION

It is therefore a general object of the present invention to overcome the aforementioned disadvantages.

More particularly, it is an object of the invention to provide an improved measuring apparatus of the aforedescribed kind in which the detected data are optically indicated without the use of intermediate electronic or mechanical auxiliary means.

In keeping with these objects, and others which will become apparant hereafter, one feature of the invention resides, in a device for measuring physical quantities as a function of a transmitted magnetic field, in the provision of a magnetic field receiver, including a magnetooptical element and an optical indicator including optical polarizing means arranged in alignment with the magnetooptical element to indicate Faraday rotation.

The measuring device of this invention utilizes in an advantageous manner the known Faraday effect in magnetooptical substances. In passing a light beam polarized by a polarizer through the magnetooptic element, the plane of polarization of the light beam is rotated up to 45° in dependency on the strength of magnetic field applied to the magnetooptic element in the direction of the light beam. When viewed in the direction of the incident light beam, the rotation is clockwise when the direction of the magnetic field coincides with the direction of the incoming light beam, and counterclockwise when the applied magnetic field is opposite to the direction of the light beam. When a light analyzer is adjusted to the rotated plane of polarization in such a manner that light can pass therethrough, then the angular position of the analyzer is a direct measure of the rotation of the plane of polarization. This measure is made immediately visible by means of the throughgoing light beam. As a light source ambient day light is quite sufficient for this purpose so that no additionl light generator is necessary.

The measuring device of this invention has the advantage that neither an intermediate conversion of the physical measured data in a corresponding electronic signal is necessary prior to the optical indication, nor any mechanically guided indicating elements are present. The invention makes it possible to indicate directly the measured physical data such as electrical current, length, position, liquid level and the like as an optical indication which is directly readable on a fixed or movable scale for example. The measuring device of this invention is extremely robust inasmuch as it lacks mechanically movable parts and is suitable for application under rough operational conditions, also in environments with explosion hazards. Since no movable mechanical parts are present, the device of this invention is insensitive to vibrations and in the long run it exhibits no mechanical wear or material aging. The measuring unit does not require any electrical energy and the indicated value of the physical quantity is visible so long until a new measured value is determined. The manufacture of the device of this invention can be made on a automatic processing line whereby the same technology can be used which is known from manufacturing methods in the field of microelectronics. The resolution capability of the device of this invention is very high and is limited only by the intended expenditures in manufacturing the magnetooptical element, that means in producing the structure of the magnetooptical element by means of photographic methods or by means of electron beam lithographic process. The device can be employed for measuring all physical quantities which can be represented by a corresponding magnetic field.

In an advantageous embodiment of this invention, the polarizing means of the optical indicator includes a polarizer arranged before the magnetooptical element and an analyzer of the polarized light arranged after the magnetooptical element. The indication of the measured value in this arrangement has a sufficient brightness even in the case of low intensity ambient light.

In the preferred embodiment of this invention, the magnetooptic element includes a plurality of superposed zones of a magnetizable substance, each zone being magnetizable in a uniform direction or domain, the magnetic domains being separated from one another by straight, sharp limit lines, and the polarizer polarizing incident light in planes extending above each other over the length of the magnetooptic element in conformity with the superposed magnetic domains. Similarly, the analyzer of the output light beam also extends over the entire length of the magnetooptic element. Such a construction of the magnetic field receiver permits the application of the device of this invention in measuring lengths, positions, and temperatures. By magnetzing adjoining domains of the magnetooptic element in opposite directions and by adjusting the analyzer to one of the two rotated planes of polarization, light passing through one domain will pass also through the analyzer whereas light passing through the adjoining domain is blocked. Accordingly, a sharp bright-dark edge will appear on the rear side of the analyzer or on the graduated scale arranged before or behind the analyzer to facilitate a reading of the indicating mark.

The size of the magnetized domains is arbitrarily adjustable so as to achieve a desired resolution, for example of 1 mm. The material of the superposed magnetizable domain are preferably thin plates cutout of a monocrystal so that the boundary lines of the domains extend transversely to the direction of incidence of the light beam. In another embodiment, the domains of the magnetooptical element are produced in an expitaxial process or by growing from vapors thin layers superposed in the direction of incident light. As a starting material can be employed all substances which have a distinct magnetooptic effect, the so-called magnetooptically active media. With advantage, the material of the magnetooptic element is preferably a garnet containing if desired admixtures of other substances such as metals, gadolinium or lanthanide series elements, yttrium and the like.

When the measuring device of this invention is used as a thermometer then it is of advantage when the garnet includes admixtures of elements of lanthanide series added so that the Curie point of consecutive domains monotonely increases or decreases. Above the Curie point the motion of molecules due to heating causes their orientation opposite to the magnetic field so that the Faraday effect does not occur. When, in accordance with this invention, the Curie point of individual domains is set by different admixures of metallic atoms in such a way that with increasing temperature the Curie point in the domains is continuously exceeded in the temperature range from the lowermost to the uppermost domain, then due to the missing rotation of the polarization plane from the lower domain to the upper one, the passage of light through the polarizing means is readily blocked. Accordingly, on a scale arranged before or after the analyzer, an upper light range and a lower dark range is separated along a domain boundary line by a sharp edge. With increasing temperature the separating edge is shifted due to the aforedescribed sloping of the garnet, in upward direction.

In still another advantageous embodiment for use as a liquid level gauge in connection with liquid storing container, there is provided a float including a magnetic field generator, and the magnetic field receiver being coupled with the generator for a predetermined length of lift of the float. The magnetic field generator produces two opposite magnetic fields oriented in the direction of light beam incident on the magnetic receiver to produce antiparallel magnetic domains in the magnetooptical element. In comparison with conventional liquid level gauges the device of this invention has the advantage of measuring the level with a high resolution whereby the optical indication provides a continuous reading. For magnetizing respective domains of the magnetooptic element, only minute field strengths of about 5 to 10 Oersted (Oe) are needed. Consequently, the floats of the liquid level gauge can be equipped with an extremely light magnetic field generator assembled for example of small size permanent magnets supported on correspondingly small floats and movable in measuring pipes of reduced clearance. Apart from technical advantages of this arrangement, considerable savings in production costs also result. Moreover, the actual arrangement in the measuring type presents new construction possibilities and larger design freedom. Due to the improved economy, increased accuracy for mechanical resistance and simultaneously due to the reduced size of the measuring system, an overall cost reduction is achievable.

The magnetic field generator includes preferably a permanent magnet oriented in the direction of displacement of the measuring float. The oppositely directed magnetic lines of the field generated by the permanent magnet magnetize the domains above the center of the magnet in one direction while the domains below the center of the magnet are magnetized in opposite direction and accordingly the scale arranged before or behind the analyzer is illuminated or screened in conformity with the position of the center of the permanent magnet. Since the center of the magnet corresponds to the momentary liquid level in the tank, the separation line between the bright-dark range on the scale indicates the momentary level.

In a modification, the float of the liquid level gauge includes a disc of ferromagnetic material supporting at opposite sides two permanent magnets oriented in opposite directions of their magnetic flux. In this arrangement the magnetooptic element is exposed to three magnetic fields whereby the magnetic field which is flush with the ferromagnetic disc is delimited at both sides thereof by two magnetic fields of equal intensity but of opposite orientation. In this case the polarization analyzer is adjusted for detecting the rotation of the polarization plane of the intermediate magnetic field. As a result a very narrow zone on the scale is illuminated thus making it possible to read a point-like graduation on the scale corresponding to the momentary liquid level.

In another modification of this invention, the magnetooptic element is provided with sensors of magnetic field producing corresponding electrical signals which are applied to an evaluation logic circuit. Such magnetic field sensors enable a remote indication of the measured values. The sensors by a suitable technology can be incorporated in the magnetooptic element or mounted on the latter. For example, each magnetizing domain of the magnetooptic element can be provided with magnetic field sensor in the form of a permalloy layer. The corresponding array of superposed permalloy sensors permits a substantially higher resolution in the remote indication than is the case with conventional read contact bars.

In an environment which is liable to explosions, forked light barriers can be used as optical sensors.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

FIG. 3 is a sectional side view of a cut-away part of a magnetooptic element in the liquid level gauge of FIG. 1, shown on an enlarged scale;

FIG. 4 is an exploded perspective view of the magnetic field receiver in the measuring device of FIG. 1 showing on an enlarged scale a polarizer, a magnetooptic element, an analyzer and a graduated scale;

DESCRIPTION OF THE PREFERRED EMBODIMENTS

Figure 1:
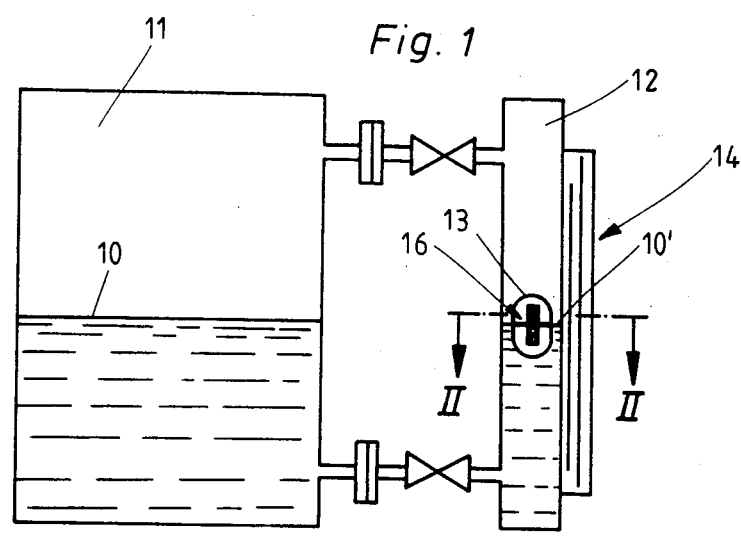
FIG. 1 is a schematic side view of a storing tank for liquid connected to a liquid level gauge constructed according to this invention.
Figure 2:
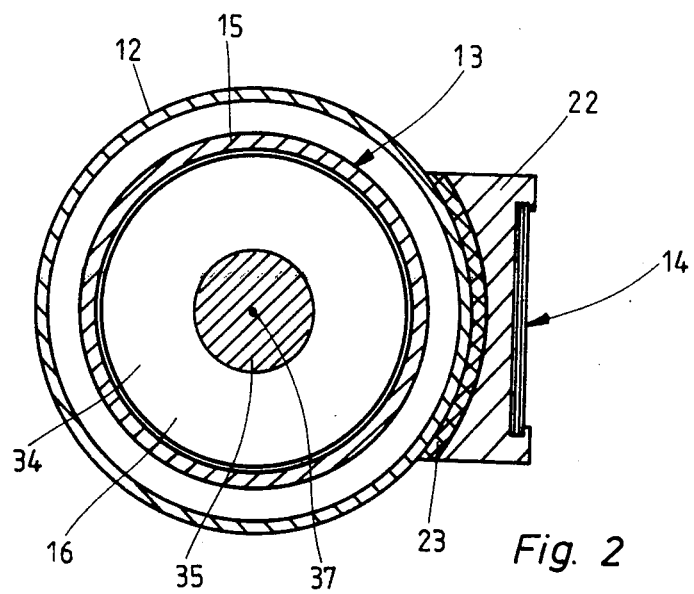
FIG. 2 is a sectional top view taken along the line II—II in FIG. 1.

FIGS. 1 and 2 illustrate a liquid level gauge in connection with liquid storing container 11 in which the level 10 of stored liquid is to be indicated by optical means. For this purpose, an upright measuring pipe 12 is connected as a bypass conduit to the container 11 so that according to the principle of communicating pipes the liquid level 10' in the measuring pipe 12 corresponds to that in the container. The height of the liquid level 10' is transmitted by a magnetic float 13 to a magnetic receiver 14 including a measuring and indicating device. The magnetic float 13 includes a housing 15 (FIG. 2) in which a magnetic field generator is arranged in such a manner that its magnetic field affects the measuring device in the receiver which in turn controls the optical indicator. In this embodiment the magnetic field generator 16 is constructed as a small permanent magnet whose magnetic axis is oriented in the direction of lifting of the float 13 or of the liquid level 10'.

The measuring and indicating devices in the magnetic receiver 14 of the liquid level gauge is constructed as a magnetooptic element 17 (FIGS. 3 and 4) which is in optical alignment with a polarizing arrangement 47. The latter arrangement includes a polarizer 18 arranged in the path of incident light before the magnetooptical element 17, and a light analyzer 19 arranged in the path after the magnetooptic element. Behind the analyzer 19, a transparent measuring scale carrier 20 is arranged, provided with a graduation 21 (FIG. 4). The graduation illustrated in detail in FIGS. 6 and 7, can be applied on the scale carrier 20 by etching technology or by a vaporizing operation. In a modification, it is possible to dispense with the scale carrier 20 and create the graduations 21 by a suitable method directly on the rear side of the analyzer 19 or on the rear side of element 17.

As shown in FIG. 2, the measuring and indicating devices of the magnetic receiver 14 are mounted on the outer surface of the measuring pipe 12 which is made of a diamagnetic material. The magnetic receiver 14 is secured to the pipe 12 by means of support 22 which acts simultaneously as a light collecting member. The support 22 is made of a transparent plastic material with embedded fluorescent particles which enhance the reading of a measured value even at a low level of ambient light. If desired, the fluorescent particles can radiate at different colors. A thermal insulating layer 23 is provided between the support 22 and the wall of measuring pipe 12.

As illustrated in FIGS. 3 and 4, the magnetooptic element 17 consists of a stack of superposed magnetic domains 24 that means of superposed rows or zones each having a uniform magnetizing direction. The domains 24 are arranged transversely to the direction 26 of incident light and are separated one from each other by straight, sharp boundary lines 25. In this embodiment, the magnetooptic element 17 is made of a garnet crystal containing admixtures of other metals such as gadolinium or yttrium. Each domain 24 is cutout of such a monocrystal to form a thin rectangular plate. In a variation, the domains 24 can be produced by an epitaxial method by vaporizing thin layers of the monocrystal. As mentioned before, the thin plates or layers 24 extend transversely to the path 26 of incident light (FIG. 4). The polarizer 18, analyzer 19 and the scale support 20 are also arranged transversely to the direction of incident light and extend over the entire length of domains 24 of the magnetooptic element 17. The vertical dimension of the entire magnetic receiver 14 corresponds to the maximum lift of the float 13 or of the magnetic force generator 16, that is to the maximum variations of the liquid level 10' in the measuring pipe 12. The graduation 21 is oriented in the longitudinal direction of the domains that is transversely to the direction of incident light, and the spacing between graduation lines either corresponds to that between the boundary lines of the domains or to a multiple thereof.

The measuring device and indicating arrangement in the magnetic receiver 14 utilizes Faraday effect in magnetooptic substances as it will be explained below with reference to FIG. 4:

Non-polarized light 27 propagating in different planes of polarization impinges in the direction 26 on the polarizer 18 in which it is polarized in planes oriented in the direction 28. Two superposed groups of domains 24 separated by a domain boundary line 25 are magnetized by the magnetic field generator in two opposite directions as indicated in FIG. 4 by opposite arrows representing the flux of magnetic field. Due to Faraday effect the incident light polarized in planes 28 in passing the magnetooptic element 17 is rotated up to 45° in such a manner that in the upper group of domains, when viewed in the direction 26 of the incident light is rotated clockwise while in the lower group of domains it is rotated counterclockwise. The plane of polarization of light passing through the upper group of domains is indicated by arrow 29 and the plane of polarization of light passing through the lower group of domain is indicated by arrow 30. The light analyzer 19 is adjusted so as to pass through the light portion only which oscillate in the polarization plane 29. Accordingly, the scale support 20 is illuminated on its upper half 31 while the lower zone 32 is dark and is separated from the bright zone by a sharp separation line 33. The separation line 33 corresponds to the separation border line 25 between the groups of domains 24 of opposite magnetization. This opposite magnetization of the domains 24 is retained so long until Curie point of temperature of magnetooptic substance is exceeded or if counteracting fields are applied to respective groups of domains 24. Consequently, the measured value determined by the separation line 33 on the scale 21 is readable so long until next value is indicated. The two opposite magnetic fields oriented substantially in the direction 26 of incidence of the light are generated by the beforedescribed magnetic field generator 16. The upper bright zone 31 and the lower dark zone 32 separated by separation line 33 will result from the construction of the magnetic field generator 16 which includes a small permanent magnet whose polar axis is oriented in the direction of travel of the float 13. The separation line 33 then corresponds approximately to the level of the center of the permanent magnet, thus indicating the level 10'0 in the measuring pipe 12. If this level is changed, then separation line 33 on the scale 21 travels in corresponding direction upwards or downwards.

Figure 5:
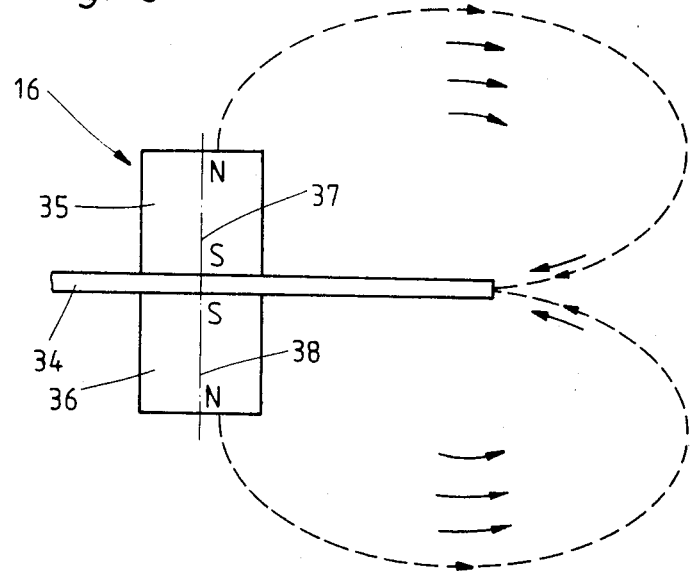
FIG. 5. shows schematically in a side view a magnetic field generator in the liquid level gauge of FIG. 1, illustrated on an enlarged scale with indicated magnetic field.
Figure 6:
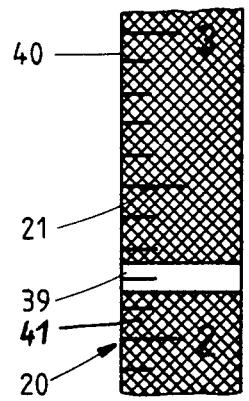
FIGS. 6 and 7 show, respectively, a graduated scale at the magnetic receiver of the device of FIG. 1, shown with different modes of indication.
Figure 7:
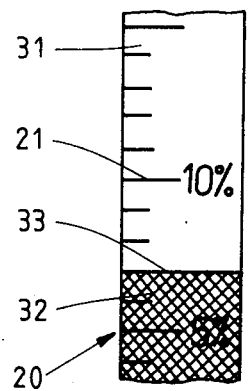

In the embodiment shown in FIG. 2 and illustrated in greater detail in FIG. 5, the magnetic field generator 16 can be assembled of two permanent magnets 35 and 36 whose magnetic axes 37 and 38 are in alignment and being separated by a disc 34 of a ferromagnetic material. The magnets 35 and 36 form right angles with the disc 34 and adjoin the latter with corresponding magnetic poles. The permanent magnets are of equal size and strength whereby north poles are at free ends of the magnets while the south poles adjoin the disc 34. Magnetic field generated by this arrangement is indicated in FIG. 5 by dashed lines. The magnetooptic element 17 which is fixed in the range of movement of the float 13 on the upper surface of the measuring pipe 12 is exposed to three kinds of magnetic fields generated by the generator 16. A zone of the magnetooptic element 17 which is levelled with the ferromagnetic disc 24 is exposed to a magnetic field whose direction is opposite to the direction 26 of the incident light. The regions of the magnetooptic element 17 above and below this zone are exposed to magnetic fields of equal strength but of opposite directions with respect to the central magnetic field. In this arrangement of magnetic fields acting on the magnetooptic element 17 the polarization plane 28 of light passing through the element 17 is rotated in the beforedescribed manner, namely in the upper groups of domains 24 when viewed in the direction of incident light, it is rotated clockwise and in the intermediate narrow zone including a group of only a few domains 24, it is rotated counterclockwise. The analyzer 19 permits the passage of light only which oscillates in the polarization plane 29. Accordingly, the scale carrier or support 21 is illuminated in the manner as illustrated in FIG. 6. A very narrow bright zone 39 appears at the level of the disc 34 and is limited at both sides by large dark areas 40 and 41. The narrow bright zone 39 represents the indication mark which on the graduation 21 indicates the momentary liquid level.

Figure 8:
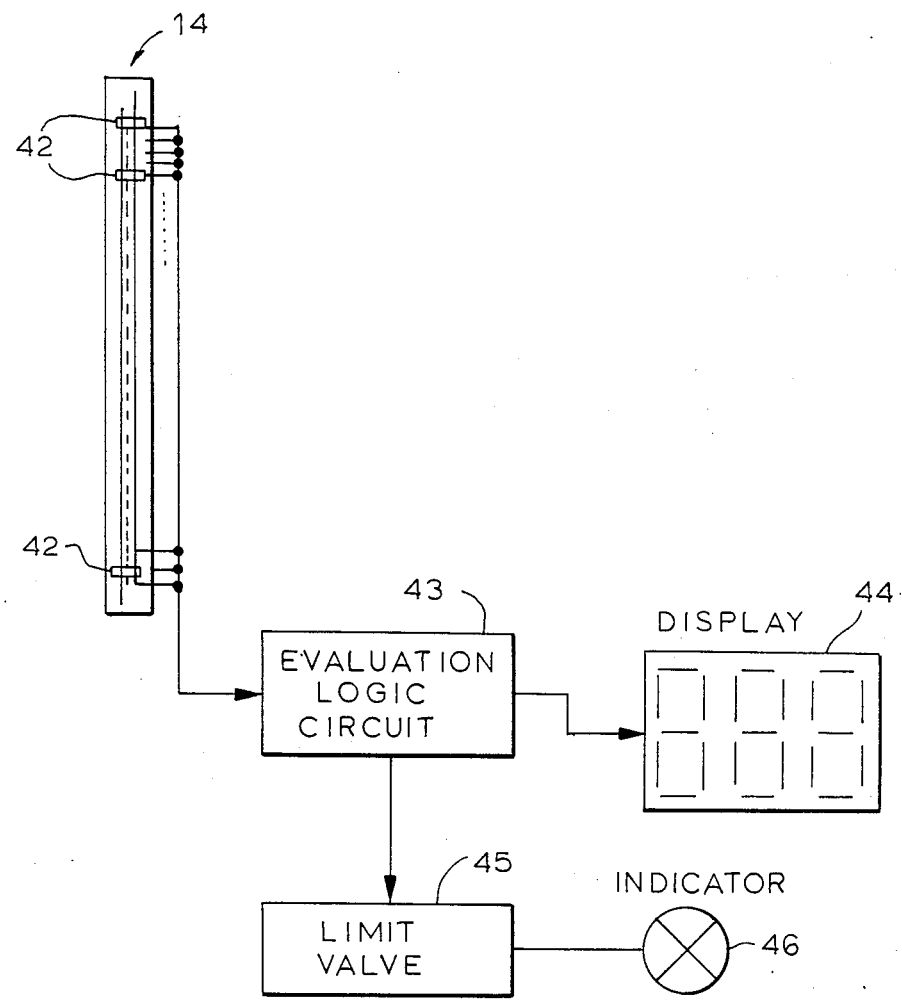
FIG. 8 is a block circuit diagram of a modification of the magnetic receiver in the measuring device of this invention for use in electric remote indication of measured data.
Figure 9:
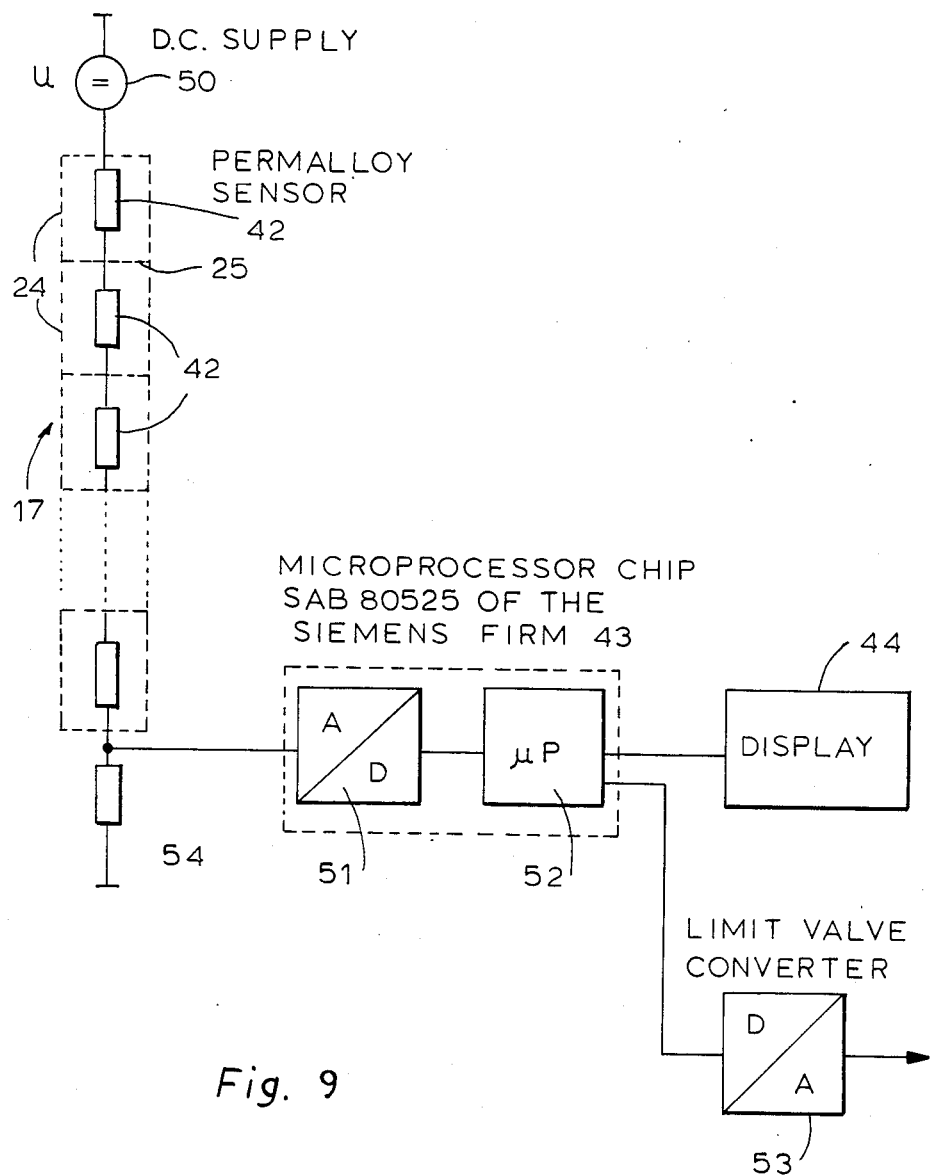
FIG. 9 shows electrical circuits for the magnets-optic element.

In many instances it is desirable to provide an electrical remote indication of measured values appearing on the optical scale 20. For example, in an explosive environment there can be used sensors in the form of forked light barriers which optically scan the scale support 20 and produce electrical signals indicative of the illuminated mark. In the embodiment shown in FIG. 3, there are employed magnetic field sensors in the form of permalloy layers 42. These permalloy layers (alloys of iron and nickel having a particularly high magnetic susceptibility) are arranged within respective domains 24 and as it will be seen from FIG. 3, are of substantially smaller dimensions. The permalloy layers 42 can be produced by an evaporation process during the manufacture of the magnetooptic element 17. As known, permalloy when exposed to magnetizing force changes its electric properties, such as resistance for example. Electrical signals derived from the permalloy sensors 42 by a suitable electric circuit including D.C. supply 50 and voltage dividing resistor 54, are fed to an evaluation logic circuit 43 as schematically indicated in FIG. 8 and displayed on a digital indicator 44. As shown in FIG. 9, the evaluation circuit 43 includes an analog-to-digital (A/D) converter 51, and a microprocessor (uP) 52. The evaluation circuit in FIG. 8 controls also a limit value converter 45 provided with a warning lamp 46 for example. Instead of the warning lamp, the digital to analog (D/A) limit value converter 53 in FIG. 9 may also control other devices such as valves or pumps. Inasmuch as permalloy layer 42 is provided in each magnetooptic domain 24, a corresponding resolution can be achieved at the remotely controlled indicator. This resolution is higher than in conventional remotely controlled devices using arrays of reed switches.

The invention is not intended to be limited to the beforedescribed exemplary embodiment of a measuring device for use as a liquid level gauge. For example, the measuring device of this invention is applicable in all fields where a physical quantity to be measured can be represented in some way by changes in the magnetooptic substance. This is possible for example in measuring length as well as intensity of currents and in measuring temperatures.

The application of the measuring device of this invention as a thermometer has been already mentioned before. The measurement is based on the fact that upon exceeding Curie point in the temperature of the magnetooptic substance, the magnetic orientation in the domain 24 is neutralized. If the domains 24 are produced in such a way that Curie point of consecutive domains increases then with increasing temperature the different Curie points are gradually exceeded and in this manner the device of this invention can be used as a temperature measuring apparatus.

In another modification of the previously described liquid level gauge, the relative movement between the magnetic field transmitter 16 and the magnetooptic receiver 14 can be realized by fixing the magnetic transmitter on the outer wall of the measuring tube 12 while the magnetic receiver containing the magnetooptic element and the polarizing arrangement can be arranged in the movable float 13.

The scale support 20 can be also arranged between the analyzer 19 and the magnetooptic element 17 or the scale carrier 20 can be dispensed with and the graduation 21 can be applied directly on the analyzer 19 or the magnetooptic element 17.

It will be understood that each of the elements described above, or two or more together, may also find a useful application in other types of constructions differing from the types described above.

While the invention has been illustrated and described as embodied in specific examples of the measuring device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A device for measuring physical quantities such as length, angle, position, temperature electric current, comprising means for generating a magnetic field whose parameters are a function of a quantity under measurement; a magnetooptic element arranged for intercepting said magnetic field and for receiving light emitted from a light source, said magnetooptic element producing a Faraday rotation of light passing therethrough; polarizing means optically coupled to said magnetooptic element to detect said Faraday rotation; indicating means for intercepting light emerging from said polarizing means to indicate a value of said quantity under measurement, said polarizing means including a polarizer arranged in the path of light rays before the magnetooptical element, and an analyzer arranged after the magnetooptical element; and said magnetooptic element being assembled of a plurality of superposed rows of a magnetooptic material extending transversely to the path of incident light, said rows forming domains which are uniformly magnetizable by the intercepted magnetic field and being separated by sharp demarkation lines ones from the other, and the polarizing means covering the overall area of the superposed domains.

2. A measuring device as defined in claim 1, wherein the magnetooptic element and the polarizing means are arranged on a light collecting support.

3. A measuring device as defined in claim 2, wherein the light collecting support includes fluorescent particles.

4. A measuring device as defined in claim 1, wherein the indicating means includes a translucent support arranged after the magnetooptic element and including graduation lines extending transversely to the direction of incoming light.

5. A measuring device as defined in claim 4, wherein the clearance between the graduation lines corresponds to the spacing between the demarcation lines of the domains of the magnetooptic element or to a multiple thereof.

6. A measuring device as defined in claim 1, wherein the domains of the magnetooptical element are made of thin plates cut of a monocrystal and extending transversely to the path of incoming light.

7. A measuring device as defined in claim 1, wherein the domains of the magnetooptic element are thin layers formed in vapor phase from a monocrystal by an expitaxial method.

8. A measuring device as defined in claim 1, wherein the domains of the magnetooptic element are made of garnet.

9. A measuring device as defined in claim 8, wherein the garnet includes admixtures of other metals such as elements of lanthanide series.

10. A measuring device as defined in claim 9 for use as a thermometer comprising superposed magnetizing domains of garnet, the garnet in respective zones having different admixtures of elements of lanthanide series to produce different Curie points in consecutive domains.

11. A measuring device as defined in claim 10 , wherein the Curie points in consecutive domains uniformly increase or decrease.

12. A measuring device for use as a liquid level gauge in connection with liquid storing containers, comprising a measuring pipe communicating with the container; a float arranged in the pipe and including means for generating a magnetic field; a magnetooptic element arranged for intercepting said magnetic field and for receiving light emitted from a light source, said magnetooptic element producing a Faraday rotation of light passing therethrough; polarizing means optically coupled to said magnetooptic element to detect said Faraday rotation; indicating means for intercepting light emerging from said polarizing means to indicate a value ofsaid liquid level,said indicating means together with said magnetooptic element and said polarizing means being fixedly arranged on the outer surface on the measuring pipe extending over the range of movement of the float; said polarizing means including a polarizer arranged in the path of light rays before the magnetooptical element, and an analyzer arranged after the magnetooptical element; said magnetooptic element being assembled of a plurality of superposed rows of a magnetooptic material extending transversely to the path of incident light, said rows forming domains which are uniformly magnetizable by the intercepted magnetic field and being separated by sharp demarkation lines one from the other, and the polarizing means covering the overall area of the superposed domains; each domain of said magnetooptic element being provided with a magnetic field sensor for generating an electrical output signal whose value changes in dependence on the direction of magnetic field through said domain; and further comprising an evaluation circuit connected to said magnetic field sensors to transform their electrical output signals into a data signal, said data signal being applied to a display device to indicate the value of said liquid level.

13. A measuring device as defined in claim 12, wherein the measuring pipe is of a diamagnetic material.

14. A measuring device as defined in claim 12, wherein each magnetic field sensor is in the form of a permalloy layer arranged in each domain of the magnetooptic element.

15. A measuring device as defined in claim 12, wherein the means for generating magnetic field generates two oppositely directed magnetic fields transmitted through the magnetooptic element transversely to the direction of incoming light to produce two adjoining groups of domains magnetized in opposite directions.

16. A measuring device as defined in claim 15, wherein the magnetic field generator includes a permanent magnet oriented in the direction of movement of the float.

17. A measuring device as defined in claim 16, wherein the magnetic field generator includes a disc of a ferromagnetic material and two permanent magnets of the same size arranged in alignment with each other at opposite sides of the disc, the two permanent magnets facing each other with equal magnetic poles.

* * * * *